United States Patent
Takeuchi et al.

(10) Patent No.: US 6,813,829 B2
(45) Date of Patent: Nov. 9, 2004

(54) METHOD FOR REMOVING PUNCHED FRAGMENTS AND A METHOD FOR PRODUCING AN ARTICLE BY PUNCHING

(75) Inventors: Yukihisa Takeuchi, Nishikamo-gun (JP); Hiroyuki Tsuji, Nagoya (JP); Kazumasa Kitamura, Itinomiya (JP); Yoshinori Yamaguchi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 128 days.

(21) Appl. No.: 10/128,152

(22) Filed: Apr. 23, 2002

(65) Prior Publication Data

US 2002/0166425 A1 Nov. 14, 2002

(30) Foreign Application Priority Data

Apr. 27, 2001 (JP) ........................................ 2001-131225

(51) Int. Cl.[7] .................................................. H05K 3/36
(52) U.S. Cl. .............................. 29/830; 29/846; 29/852; 29/861
(58) Field of Search .......................... 29/830, 852, 743, 29/759, 464, 465, 467, 469; 72/355.4; 83/100, 142, 168, 177, 425.3, 468.2

(56) References Cited

U.S. PATENT DOCUMENTS

| | | | |
|---|---|---|---|
| 4,432,037 A | * | 2/1984 | Brabetz |
| 5,316,602 A | * | 5/1994 | Kogame et al. |
| 5,857,397 A | * | 1/1999 | Matsubayashi et al. |
| 6,502,302 B2 | * | 1/2003 | Takeuchi et al. |
| 6,637,102 B2 | * | 10/2003 | Takeuchi et al. |

FOREIGN PATENT DOCUMENTS

| JP | 06-278093 | 10/1994 |
|---|---|---|
| JP | 07-266294 | 10/1995 |

OTHER PUBLICATIONS

U.S. patent application Ser. No. 09/883,133, Takeuchi et al., filed Jun. 15, 2001.
U.S. patent application Ser. No. 09/771,223, Takeuchi et al., filed Jan. 26, 2001.
U.S. patent application Ser. No. 10/160,998, Takeuchi et al., filed Jun. 3, 2002.

* cited by examiner

*Primary Examiner*—Eric Compton
(74) *Attorney, Agent, or Firm*—Burr & Brown (57) ABSTRACT

In a method for removing punched fragments in a workpiece formed using a punch and a die, the workpiece, which is tightly attached to a stripper, is lifted without extracting the punch from the perforations formed in the workpiece, subsequently pushing back the punch lifted from the die so as to make it protrude slightly from the bottommost end of the perforations, and performing an operation for removing punched fragments in that condition. The method for removing punched fragments can easily be performed even if only a very narrow space is available in a counterbore of a die, and can ensure that no punched fragments remain inside the perforations, and therefore can improve yield of a product being fabricated. A method for producing an article by punching inclusive of the method for removing the punched fragments is also disclosed herein.

18 Claims, 6 Drawing Sheets

METHOD FOR REMOVING PUNCHED FRAGMENTS AND A METHOD FOR PRODUCING AN ARTICLE BY PUNCHING

This application claims the benefit of Japanese Application 2001-131225, filed Apr. 27, 2001, the entirety of which is incorporated herein by reference.

BACKGROUND OF THE INVENTION AND RELATED ART

The present invention relates to a method for removing punched fragments, and a method for producing an article by punching including the method for removing punched fragments. More particularly, the present invention relates to a method for removing punched fragments which can be easily performed on the upper side of a die and is suitable for use in punch work with an extra-fine punch or punch work performed with small punching pitch, and a method for producing an article by punching including the method for removing punched fragments.

In recent years, in the application of punch work using a punch and a die, there has been an increasing demand for forming perforations with smaller diameters and in higher density.

For example, in the case of a circuit board on which electronic components are mounted, it is required to provide numerous small perforations with high precision so that a circuit can be formed with higher density while maintaining high reliability, taking into consideration the cooling effect.

When providing a large number of small perforations on a workpiece for punching, it is essential that the punching operation be performed in such a way that high precision perforations are arranged with uniform spacing, but at the same time it is also important to thoroughly remove punched fragments, which are generated while forming perforations on the workpiece, from the punching machine using a punch and a die, in particular, from the surrounding area of the workpiece to prevent the punched fragments from plugging the product. If the punched fragments are not thoroughly removed and, for example, have entered the perforations of a workpiece for punching, it they will render the product defective, resulting in a reduced product yield. Frequent recurrence of such defects will cause an increase in manufacturing cost, eventually leading to a loss of competitiveness.

Figure 2A:
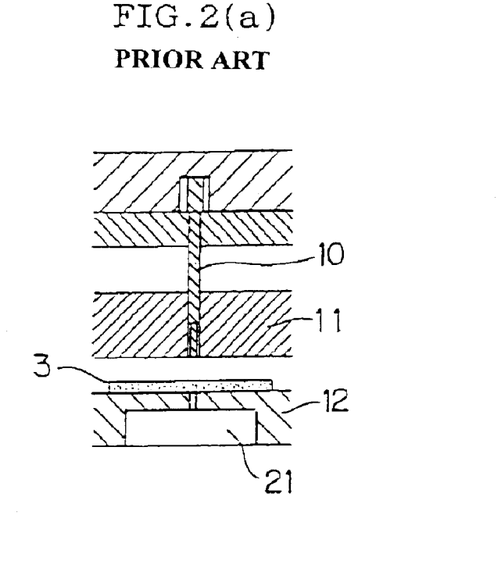
FIG. 2(a) illustrates a preparatory step in which a thin workpiece for punching is mounted on a die, and FIG. 2 (b) illustrates a punching step in which the workpiece is perforated.
Figure 2B:
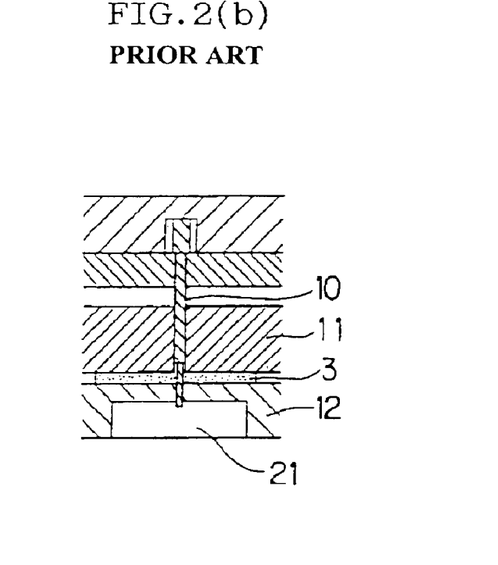

FIG. 2(*a*) and FIG. 2(*b*) illustrate an example of a conventional process of punch work using a punch and a die.

As shown in FIG. 2(*a*), a thin workpiece 3 for punching is first mounted on a die 12 as a preparatory step, and the workpiece 3 is perforated with a punch 10 as shown in FIG. 2(*b*). The punched fragments are removed in the next step, conventionally maintaining the condition as shown in FIG. 2(*b*), namely, in a condition whereby the punch 10 is protruding into a counterbore 21 of a die 12 after performing punching on the workpiece 3 on the die 12.

Since most of the punched fragments fall into the counterbore 21 side of the die when perforations are formed by the punch 10, the punched fragments have been removed from the counterbore 21 side of the die by means of vacuum suction, or conversely by blowing with compressed air, or alternatively by having the punched fragments adhere to an adhesive medium, so that punched fragments will not remain in the perforations on the workpiece 3. However, it has been observed that a part of the punched fragments sometimes remains attached to the punch 10, causing a plugging by punched fragments that enters the perforation when the punch 10 is pulled up.

Further, the method for removing punched fragments as described above is applicable for a punching machine such as the one illustrated in FIG. 2(*a*) and FIG. 2(*b*), which employs a larger diameter for the punch 10 and a greater punching pitch that can allow a wide distance between juxtaposing punches and therefore has ample space in the counterbore 21 of the die. However, when forming perforations on the workpiece 3 with a smaller diameter and in higher density as in the requirement in recent years, it becomes unavoidable to use an extra-fine punch and a narrower punching pitch. For such a punching machine, which employs a smaller diameter for the punch 10 and a narrow punching pitch allowing only a shorter distance between juxtaposing punches, the removal of the punched fragments as described above has been difficult to apply.

Figure 3A:
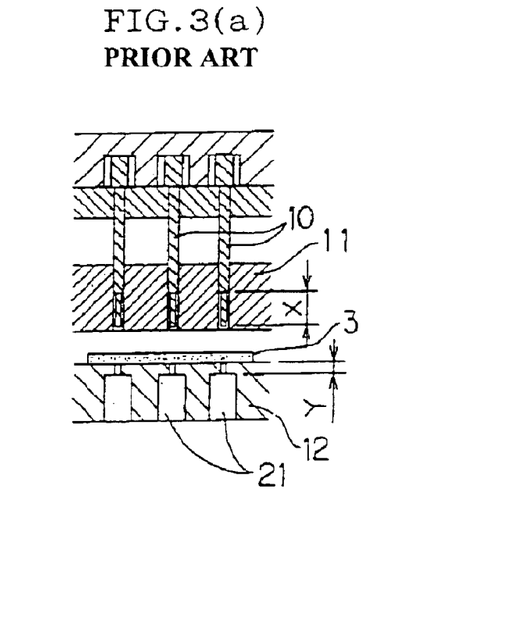
FIG. 3(a) illustrates a preparatory step in which a thin workpiece for punching is mounted on a die.
Figure 3B:
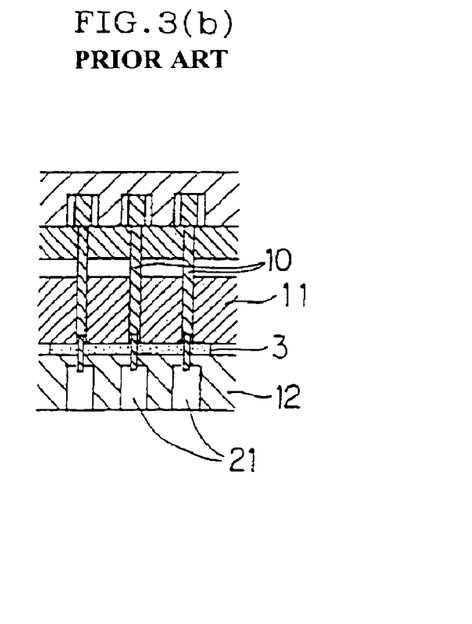
FIG. 3(b) illustrates a punching step in which the workpiece is perforated using a punch.
Figure 4A:
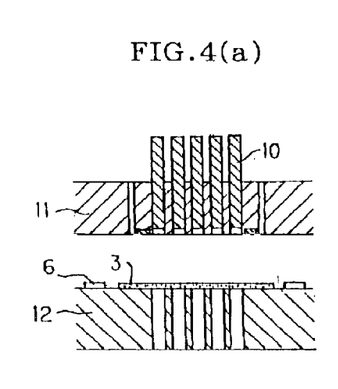
FIG. 4(a) illustrates a preparatory step for the first sheet in which a thin workpiece for the first punch work is mounted on a die.
Figure 4B:
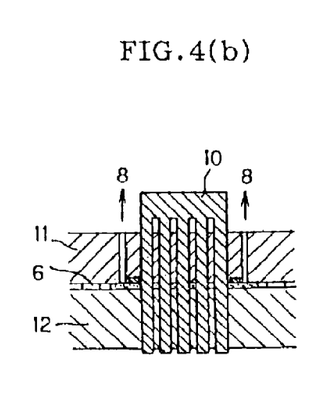
FIG. 4(b) illustrates the first punching step in which the first sheet workpiece is perforated using a punch.
Figure 4C:
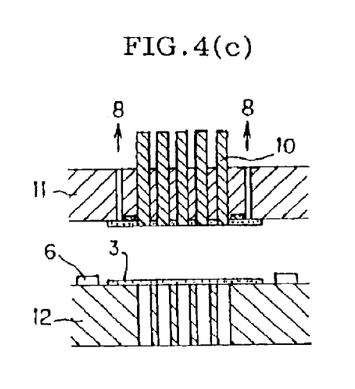
FIG. 4(c) illustrates a preparatory step for the second sheet.
Figure 4D:
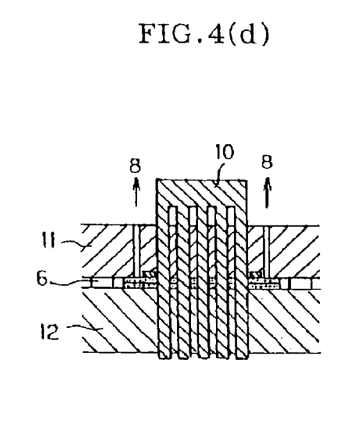
FIG. 4(d) illustrates the second punching step.
Figure 4E:
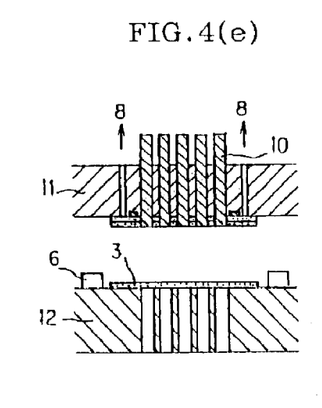
FIG. 4(e) illustrates a preparatory step for the third sheet.
Figure 4F:
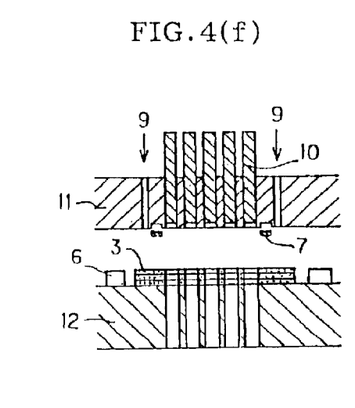
FIG. 4(f) illustrates a completing step for the sheet punching in which the stack of laminated workpieces is removed from the stripper after completing the punch work and lamination for the entire stack of sheets.

For example, along with the trend toward making perforations with an increasing degree of miniaturization and in higher density, it is becoming popular to use punching machines employing an extra-fine punch tip and a minuscule punching pitch, such as the one for which the punching process is as shown in FIG. 3(*a*) and FIG. 3(*b*). The difference in structure between this punching machine and a punching machine, for which the punching process is as illustrated in FIG. 2(*a*) and FIG. 2(*b*), exists in the counterbore 21 of the die. In the configuration as illustrated in FIG. 2(*a*) and FIG. 2(*b*), ample cubic size is secured at the counterbore 21 of the die to permit smooth removal of punched fragments, whereas in the configuration as illustrated in FIG. 3(*a*) and FIG. 3(*b*), the counterbore 21 is made much smaller as a means of preventing the die 12 from losing rigidity. As a result, it does not provide sufficient cubic size for a smooth removal operation of punched fragments.

For a punching machine such as described above, in particular, the frontal portion X of the punch 10 with a reduced diameter cannot be made too long from a durability standpoint. At the same time, since it is desirable to have the punching tip protrude into the counterbore 21 of the die for easy removal of punched fragments, the corresponding distance Y of the opening at the die 12 also cannot be made long. This decreases the thickness of the upper side of the counterbore 21 of the die, thereby reducing rigidity of the die 12.

Therefore, it is necessary to make the size of the counterbore 21 of the die smaller to increase rigidity of the die 12. However, since such a design has made it difficult to secure the cubic size required for a removal operation of punched fragments, the removal of punched fragments could not be performed adequately.

When a narrower punching pitch is employed, greater shearing force from the punch 10 works against the workpiece 3, thereby increasing the load on the die 12. Because of this, for the purpose of increasing the strength of the die 12, reinforcement such as a rib member at the counterbore 21 of the die has often been provided. However, such reinforcement has made the configuration of the die 12 more complex, further reducing the space available at the counterbore 21 of the die and thereby making it very difficult to remove the punched fragments according to the above method. This results in insufficient removal of punched fragments, causing punched fragments to remain inside the perforations of the workpiece 3 and eventually leading to a reduced product yield, for example.

As described above, the removal of punched fragments is an important step that has substantial impact on the product yield in punch work, whereas, in particular, for the type of punch work that is required to form perforations with an increasing degree of microminiaturization and in higher density, it is becoming more and more difficult to apply a means for removing punched fragments from the counter-bore part underneath a die. While the above suggests that there is a need for any alternative means of completely removing punched fragments from a punching machine so that no punched fragment remains inside the perforations made on a workpiece for punching, a suitable method has not been proposed so far.

The present invention has been made in the light of the above-described problems, and an object thereof is to solve the problems associated with the prior art. More specifically, an object of the present invention is to provide a method for removing punched fragments usable for punch work, which can be easily performed even under the condition where a die is reinforced to allow very narrow space for a counter-bore of a die, and, in particular, which can ensure that no punched fragment remains inside the perforations being formed by the punch work and thus can improve the yield of a product being fabricated with the punch work, as well as a method of manufacturing punched products comprising the method for removing punched fragments. An additional object of the present invention is, through its effect, to contribute to improving the mounting technology for installing industrial components consisting mainly of electronic devices, for example by making available products such as a circuit board and the like having numerous small-sized perforations in them.

SUMMARY OF THE INVENTION

The present inventors, after extensive study and examination of methods for removing punched fragments which is usable for punch work, have found the following: in the application of a die-punching method to form perforations in a workpiece for punching using a punch and a die, the above objective can be achieved by lifting the workpiece, tightly attached to a stripper, without extracting the punch from a perforation after the perforation is formed in the workpiece, then pushing back the punch in such a way that it protrudes slightly from the bottommost end of the perforation, and providing a removal operation of punched fragments in that condition.

Specifically, the present invention provides a method for removing punched fragments which is usable for punch work using a punch and a die, the method being characterized by forming a perforation in a workpiece for punching by punching the workpiece using the punch, lifting the workpiece, tightly attached to a stripper, from the die without extracting the punch from the perforation, and removing punched fragments in a condition where the punch is pulled up so that the tip portion of the punch protrudes slightly from the bottommost end of the perforation.

In the method for removing punched fragments according to the present invention, it is preferred that the punched fragments should be removed on the die either with an air-blow technique which removes the punched fragments using a flow of compressed air, or with an adhesion technique which removes the punched fragments by having the punched fragments adhere to an adhesive medium.

The method for removing punched fragments according to the present invention can be suitably applied in punch work to form minuscule perforations where an aperture diameter of a perforation or the shortest distance from one edge to an opposing edge of a perforation is 100 μm or less. It is also suitable for use in punch work to form perforations in a workpiece in such high density that the space between the juxtaposing perforations is 100 μm or less.

The present invention provides a method of manufacturing punched products using a punch and a die, which is characterized by comprising:

a step A of piercing a first workpiece for punching by the punch to form a first perforation in the first workpiece, a step B of lifting the first workpiece, tightly attached to a stripper, from the die without extracting the punch from the first perforation, a step C of pulling up the punch so that the tip portion of the punch protrudes slightly from the bottommost end of the first perforation, a step D of removing punched fragments, a step E of piercing a second workpiece for punching by the punch to form a second perforation in the second workpiece, a step F of lifting the second workpiece together with the first workpiece without extracting the punch from the second perforation, a step G of pulling up the punch so that the tip portion of the punch protrudes slightly from the bottommost end of the second perforation, and a step H of removing punched fragments, and thereafter laminating a plurality of workpieces to be punched with repetition of the steps E to H.

In the method for producing an article by punching to the present invention, it is preferred to pull up the punch after removing the punched fragments in the step D so that the tip portion of the punch is recessed slightly from the bottommost end of the first perforation, and also to pull up the punch after removing the punched fragments in the step H so that the tip portion of the punch is recessed slightly from the bottommost end of the second perforation. Furthermore, it is preferred to remove the punched fragments on the die by applying either an air-blow technique which removes the punched fragments using a flow of compressed air, or an adhesion technique which removes the punched fragments by having the punched fragments adhere to an adhesive medium.

Moreover, it is preferred to insert a spacer between the die and the stripper when forming perforations using the punch in the steps A and E. Concerning the thickness of such a spacer, it is preferred to make it approximately 5 to 15 μm greater than the total thickness of the workpiece that lies between the die and the stripper, in other words, the sum of the thickness of the workpieces that have already been laminated on the punch and that of the workpiece mounted on the die for forming a new perforation.

The method for manufacturing punched products according to the present invention can be suitably applied in punch work to form minuscule perforations where an aperture diameter of a perforation or the shortest distance from one edge to an opposing edge of a perforation is 100 μm or less. It is also suitable for use in punch work to form perforations in a workpiece in such high density that the space between the juxtaposing perforations is 100 μm or less.

BRIEF DESCRIPTION OF THE DRAWINGS

FIGS. 1(a) to 1(c) are process diagrams showing an example of punch work using a punch and a die according to the present invention, wherein

FIGS. 2(a) and (b) are process diagrams showing an example of punch work using a punch and a die according to the prior art, wherein

FIGS. 3(a) and (b) are process diagrams showing another example of punch work using a punch and a die according to the prior art, wherein

FIGS. 4(a) to 4(f) are process diagrams showing an example of punch work using a punch and a die according to the present invention, wherein

FIGS. 5(a) to 5(f) are process diagrams showing an example of punch work using a punch and a die according to the present invention, wherein

FIGS. 6(a) to 6(f) are process diagrams showing an example of punch work using a punch and a die according to the present invention, wherein

DETAILED DESCRIPTION OF THE INVENTION

In the following sections, preferred embodiments of the method for removing punched fragments and the method for producing an article by punching according to the present invention will be described in more detail. However, the present invention should not be construed to be limited therein; various variations, modifications, and improvements can be made without departing from the spirit and scope of the present invention based on the knowledge of those skilled in the art.

The present invention relates to a method for removing punched fragments, which is characterized in that the removal of punched fragments is operated on the upper side of a die in a condition where a punch is not extracted from a workpiece for punching after the punch work, and at the same time the workpiece is lifted while tightly attached to a stripper so that the workpiece is not placed on the die.

Since the removal of punched fragments occurs on the upper side of a die, it enables easy removal of punched fragments without being affected by the configuration of the die. In the case of a punching machine that employs a smaller-sized punch or a narrower punching pitch, although it is often difficult to secure sufficient space at the counterbore portion of a die because of reinforcement or the like, that does not pose any difficulty in performing a removal operation of punched fragments according to the present invention. Rather, the removal of punched fragments operated on the upper side of a die offers improved operability that contributes to increasing the throughput as well as improving product yield by ensuring sufficient removal of punched fragments.

Furthermore, since the removal of punched fragments is performed without extracting the punch from the workpiece and in a condition where the tip portion protrudes slightly from the bottommost end of the perforation, it is unlikely to allow ingress of any punched fragment into the perforation of the workpiece. Even if some of punched fragments remains on the tip of the punch, the punched fragments can be easily removed. It thus contributes to further lowering the rejection rate, which in turn results in an additional reduction of manufacturing cost.

Since the workpiece for punching is not placed on the die, it is easy to clean the upper side as well as the apertures of the die. However, for more complete effect methods for removing punched fragments in the prior art, i.e. those operated from the counterbore side of a die, can be used in combination with the method for removing punched fragments according to the present invention.

As for the means for removing punched fragments itself to be applied in the present invention, the same techniques as in the conventional art can be used. For this purpose it suffices to select as appropriate at least one from various available methods such as a technique to blow punched fragments off with compressed air, which requires simpler equipment among that available, or a technique to collect punched fragments with a vacuum suction, or alternatively a technique to have the punched fragments adhere to an adhesive medium.

The extra-fine sized, high-density perforations that are in demand for a circuit board for electronic circuitry can be defined, for example, as those having an aperture diameter of a perforation and an interspace between two juxtaposing perforations both in the order of several tens of micrometers. Whereas there has been a requirement in recent years for accurately forming perforations on a punched product with such small diameters as 100 $\mu$m or less with interspaces of 100 $\mu$m or less, the method for removing punched fragments and the method for producing an article by punching according to the present invention are able to adequately meet such a demand.

There are no specific limitations on the workpiece for punching to be dealt with in the method for removing punched fragments and the method for producing an article by punching according to the present invention. For example, when a soft material having Young's modulus of less than 3,000 kgf/mm$^2$ is perforated, since not all of the punched fragments fall onto the counterbore side of the die and is also apt to remain adhering to the punch, problems related to the residual of punched fragments have frequently been encountered because of insufficient removal of punched fragments in the prior art. However, according to the present invention, since the punched fragments generated upon the punch work will not afterwards remain in the perforation formed in the workpiece, and also the punched fragments left on the upper side of the die or elsewhere could be easily removed, the present invention could be suitably applied to soft materials such as mentioned above. More specifically, the present invention could be most suitably used when providing punch work on materials such as polyethylene (with a Young's modulus of 310 kgf/mm$^2$), polyimide (Young's modulus of 430 kgf/mm$^2$), reinforced plastics (Young's modulus of 2,500 kgf/mm$^2$), green sheet (Young's modulus of 4 kgf/mm$^2$), or the like. The present invention can be applied to any materials, even with a Young's modulus exceeding 3,000 kgf/mm$^2$, as long as they present the likelihood of requiring a removal operation of punched fragments.

In the following sections, an example of the method for removing punched fragments and the method of producing an article by punching according to the present invention will be described.

Figure 1A:
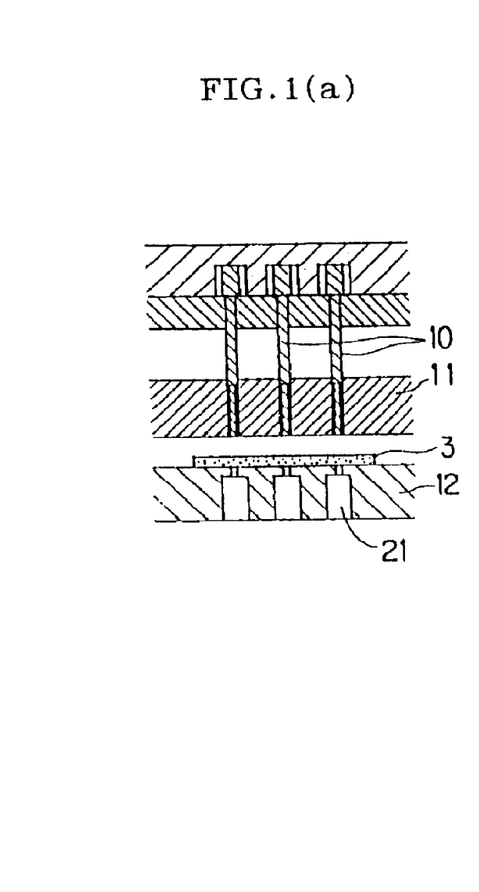
FIG. 1(a) illustrates a preparatory step in which a thin workpiece for punching is mounted on a die.
Figure 1B:
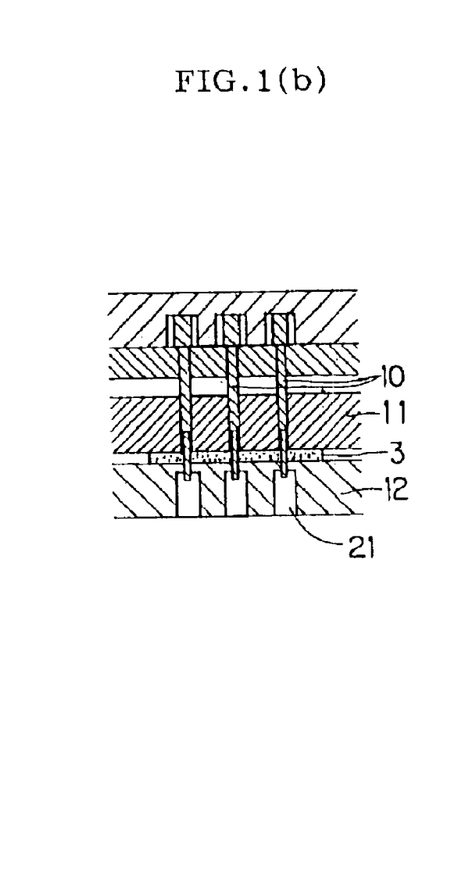
FIG. 1(b) illustrates a punching step in which the workpiece is perforated using a punch.
Figure 1C:
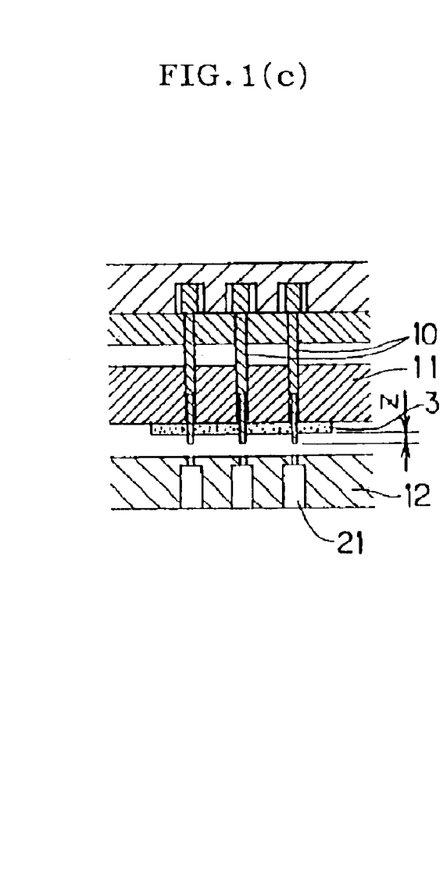
FIG. 1(c) illustrates a step for removing punched fragments in which the stripper is lifted together with the workpiece to remove punched fragments.

FIGS. 1(a) to 1(c) are diagrams illustrating a step for removing punched fragments in punch work.

The punching machine as illustrated therein comprises a punch 10, a die 12 and a stripper 11 as the main constituent equipment, whereby a workpiece 3 for punching is mounted on the die 12 and perforated with the punch 10. While there are no specific limitations for the material, size, and thickness for the workpiece 3, a thin sheet-like material, for example, is suitable as a workpiece for punching, or more specifically, a 40 μm green sheet can be used.

FIG. 1(a) illustrates a preparatory step before the punch work wherein the workpiece 3 is mounted on the die 12. Subsequently, as illustrated in FIG. 1(b), the workpiece 3 is perforated with the punch 10. At this point, punched fragments are generated with its origin at the perforations formed in the workpiece 3. Although most of the punched fragments fall onto a counterbore 21 of the die, a part of the punched fragments remains on the upper side of the die or otherwise remains adhering to the punch 10 or to the workpiece 3. At this stage, as illustrated in FIG. 1(c), the punched fragments are removed in a condition where the workpiece is lifted together with the stripper 11 so that the workpiece 3 does not remain on the die 12, and at the same time the tip of the punch 10 protrudes from the underside of the workpiece 3 by a minute distance of Z.

Unlike the methods in the prior art, the removal of punched fragments according to the present invention is not performed with the workpiece 3 left mounted on top of the die 12 after the punch work. It is essential here to transfer the workpiece 3 upward while it is tightly attached to the stripper 11 and left pierced by the punch 10. As for the means of attaching the workpiece 3 tightly to the stripper 11, for example, this can be provided by installing a suction through-hole (not shown in the diagram) on the stripper 11, from which a vacuum suction can be applied, or alternatively by applying an adhesive agent or the like on the surface of the workpiece 3 to affix it to the stripper 11.

Since the punch 10 is not yet extracted from the perforation formed by the punch work in the workpiece 3, it is practically impossible for punched fragments to remain in the perforation of the workpiece 3, hence it suffices to remove the punched fragments that remains adhering to the upper side of the die 12, on the punch 10, or the underside of the workpiece 3 in the condition as illustrated in FIG. 1(c). Accordingly, in addition to offering an easy removal operation of punched fragments, the present invention can prevent the punched fragments from entering and remaining in the perforation of the workpiece 3, thus enabling a further improvement in the product yield.

The present invention also allows the application, in parallel, of a method for removing punched fragments according to the prior art such as, for example, a vacuum suction applied from the counterbore 21 of the die. Such an operation may be performed under either the condition as shown in FIG. 1(b) or in FIG. 1(c), enabling a further reduction of problems associated with the residual punched fragments in the apertures of the die 12.

By repeating the steps as described above in reference to FIGS. 1(a) to 1(c), a punched product with a plurality of workpieces 3 laminated on top of one other (not shown in the diagram) can be manufactured. Since the punch 10 acts as a lamination axis in the above method, a plurality of workpieces 3 could be laminated without causing slippage at the perforations. Furthermore, since the punch 10 stays in the perforations throughout the punching steps, deformation of the perforations formed by the punch 10 can be prevented.

For the above reason, the present invention makes it possible to accurately form, in a punched product comprising a plurality of laminated workpieces 3, a through-hole consisting of perforations lying on top of one other as they are formed by the sheet-by-sheet punch work on each of the workpiece 3, even if the workpiece 3 has a long and narrow shape, i.e. a high aspect ratio.

When the workpiece after punch work is being laminated, it has been a general practice in the prior art to do this by transferring the workpiece after the punch work from the upper side of the die to another location. However, according to the present invention, such workpieces are laminated right on the punch 10, i.e. within the punching machine, thus dispensing with a jig to transfer the workpiece 3 or with a space on which to stack the product, thereby minimizing the number of additional manufacturing steps and enabling a further reduction in the production cost of punched products.

While it is possible to obtain a punched product consisting of a plurality of laminated workpieces by simply repeating the steps in FIGS. 1(a) to 1(c) as described above, when preparing for the next punch work after the removal of punched fragments, it is more preferable in the present invention to slightly pull in the punch 10 from the bottom-most end of the perforation of the workpiece 3 that has been lifted together with the punch 10. This ensures that the preceding workpiece 3 contacts the next workpiece 3 always before the punch 10 at the time of the next punching step, so that the next workpiece 3 for punching is pressed by the former, thus enabling the formation of perforations with higher precision.

In this case, it is essential not to retract the tip of the punch 10 too far into the perforation. If the punch 10 is retracted far inside the perforation or is housed completely inside the stripper 11, it will deform the perforation when a soft material is used as the workpiece 3, thereby degrading the precision of a through-hole formed in a punched product consisting of perforations lying one on top of the other as they are formed by the sheet-by-sheet punch work on each of the workpiece 3. There is another precaution to be taken when a soft material is used as the workpiece for punching. That is, when manufacturing a punched product by laminating workpieces for punching, the stripper collides with the workpiece on the die before the punch engages to form a perforation at the time of punching, causing the workpiece to be sandwiched between the stripper and the die. As a result, the workpiece already perforated and being stacked on the stripper, and also the workpiece mounted on the die for the next punching operation are subjected to a compression force. In case a soft material subject to deformation is used, such compression force presents the possibility of collapsing and deforming the workpiece being stacked on the stripper. If such a deformation occurs, since the punch acting as a lamination axis is rigidly fixed, this gives rise to a relative dislocation of the stacked workpieces, thereby degrading the geometric precision of the perforations already formed. Since the workpiece mounted on the die for the next punching operation is perforated by the punch in a collapsed condition due to the pressure from the stripper, the positioning as well as geometric precision of the perforations will be degraded by the amount of shape recovery from the elastic deformation, which occurs after the punch work.

Figure 8:
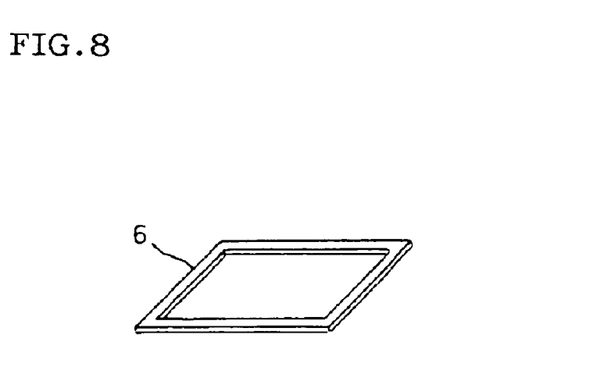
FIG. 8 is a perspective view illustrating an insertion shim that is used in the punching operation whose process is described in FIGS. 4(a) to 4(f).

In the following sections, a method for performing punch work with high precision even when a soft material is used will be explained referring to FIGS. 4(*a*) to 4(*f*), FIGS. 5(*a*) to 5(*f*), FIGS. 6(*a*) to 6(*f*), and FIG. 8. FIGS. 4(*a*) to 4(*f*), FIGS. 5(*a*) to 5(*f*), and FIGS. 6(*a*) to 6(*f*) are process diagrams showing an example of the method of manufacturing punched products according to the present invention, whereby a method using a spacer interposed between a die and a stripper is illustrated.

When forming perforations in a soft material with higher precision, it is preferred to perform the punch work using a spacer interposed between a die and a stripper as illustrated in FIGS. 4(*a*) to 4(*f*), FIGS. 5(*a*) to 5(*f*), and FIGS. 6(*a*) to 6(*f*). Using an interposing spacer makes it possible to prevent the stripper from directly impinging on a workpiece for punching and thereby subjecting the workpiece to a compression force.

FIGS. 4(*a*) to 4(*f*) illustrate manufacturing steps using an insertion shim as the spacer, for example.

FIG. 4(*a*) illustrates a state in which a thin workpiece 3 as the first sheet for punch work is mounted on a die 12 in preparation for punching. Also on the die 12 is mounted an insertion shim 6 having a shape, for example, as illustrated in FIG. 8. It is preferred to set the thickness of the insertion shim 6 approximately 5 to 15 μm thicker than that of the workpiece 3 on the die 12. Subsequently, the workpiece 3 as the first sheet for punch work is perforated by the punch 10 as illustrated in FIG. 4(*b*). The stripper 11 does not directly impinge on the workpiece 3 but collides at the insertion shim 6 having a thickness slightly greater than the workpiece 3. Therefore, even if the workpiece 3 comprises an extremely soft material it is not subjected to deformation at the time of punching, thus enabling perforations formed on the workpiece 3 to possess high precision. Next, a preparatory step for the second sheet begins as illustrated in FIG. 4(*c*), wherein the perforated workpiece 3 as the first sheet for punch work is transferred upward while it is tightly attached to the stripper 11 and left pierced by the punch 10. Another insertion shim 6 is mounted on the die 12. It is preferred to set the thickness of this insertion shim 6 approximately 5 to 15 μm greater than the sum of the thickness of the workpiece 3 that has already been perforated and lifted while being pierced by the punch 10 and that of the workpiece 3 mounted on the die 12 for the next punch work.

FIG. 4(*d*) illustrates the punching step for the workpiece 3 as the second sheet for punch work. As in the case of the first sheet illustrated in FIG. 4(*b*), the stripper 11 does not directly impinge on the workpiece 3 but collides at the insertion shim 6, thereby protecting the workpiece 3 from deformation. For the same reasons as in the previous step, perforations formed on the workpiece 3 will possess high precision. Next, a preparatory step for the third sheet follows as illustrated in FIG. 4(*e*). As in the previous steps, another insertion shim 6 is mounted on the die 12, preferably with its thickness being approximately 5 to 15 μm greater than the sum of the thickness of the workpieces 3 that have already been perforated and lifted while being pierced by the punch 10, and the workpiece 3 mounted on the die 12 for the next punch work, to prevent the stripper 11 from directly impinging on the workpiece 3. By repeating the above steps a plurality of workpieces 3 is laminated one by one within the punching machine. After perforating and laminating all sheets of workpieces 3 as illustrated in FIG. 4(*f*), the laminated workpieces 3 are removed from the stripper 11 to complete the entire punching process.

The reason for setting the thickness of the insertion shim 6 to be mounted on the die 12 at the time of perforating the workpiece 3 with the punch 10 to a thickness that is always greater by approximately 5 to 15 μm than the total thickness of the workpieces 3 that lies between the die 12 and the stripper 11 as described above, in other words, to a thickness that is much thicker than the sum of the thickness of the workpieces 3 that have already been perforated and lifted while being pierced by the punch 10 and that of the workpiece 3 mounted on the die 12 for the next punch work, is to ensure that the stripper 11 will not collapse the workpiece 3 either because of fluctuation in the thickness of the workpiece 3 or deformations occurring on the stripper 11 and the die 12 at the time of punching. It is not desirable if the thickness of the insertion shim 6 is less than the sum of the thickness of the workpieces 3 that have been lifted while being pierced by the punch 10 and the workpiece 3 mounted on the die 12, or even if the former is greater than the latter only by a margin of less than approximately 5 μm, since there is a possibility of the stripper 11 collapsing the workpiece 3. It is also undesirable if the positive margin above, on the contrary, is larger than approximately 15 μm, since such a difference makes it difficult to adequately control the deflection on the workpiece 3.

As long as the conditions as described above are satisfied, each time the thickness required for the insertion shim 6 becomes greater as the number of laminations of the workpieces 3 increases, different insertion shims 6 prepared for each required thickness may be used progressively in turn, or the same insertion shim 6 may be stacked one by one.

The spacer as described above using the insertion shim 6 by way of an example is a device that lies in between a die and a stripper at the time of punch work, which is capable of preventing the stripper from impinging upon a workpiece and thereby subjecting the workpiece to a compression force. Such a spacer is only required to have a thickness that is greater by approximately 5 to 15 μm than the sum of the thickness of workpiece that has been lifted while being pierced by the punch and the workpiece mounted on the die for the next punch work, and there are no specific limitations for its shape. For example, the insertion shim 6 mentioned above may be in the shape of a rectangular rod or a flat plate to sandwich the workpiece 3, or a plurality of thin disks or rectangular studs to be placed outside the four corners of the workpiece 3. However, for the ease with which workpieces can be fabricated to a uniform height (thickness) and also because the inclination of the die 12 and the stripper 11 can be conveniently suppressed, it is preferred to make it in a framework shape as illustrated in FIG. 8.

Next, a manufacturing process using a jack-up shim as another example of the spacer is illustrated referring to FIGS. 5(a) to 5(f).

A jack-up shim 5 as illustrated in FIGS. 5(a) to 5(f) is configured to move up and down inside the die 12 adjusting its height of protrusion from the upper surface of the die 12, so as to form a space between the die 12 and the stripper 11 at the time the punch 10 performs, thereby preventing the stripper 11 from directly impinging on a workpiece 3 for punching and subjecting the workpiece 3 to a compression force.

Figure 5A:
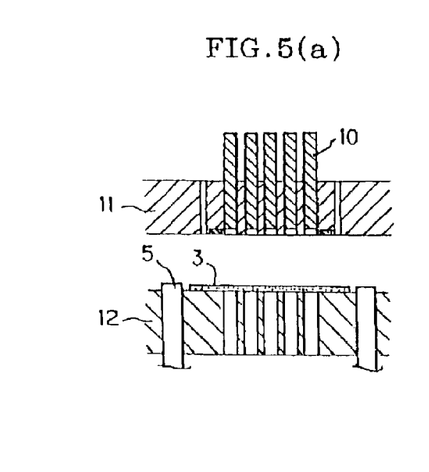
FIG. 5(a) illustrates a preparatory step for the first sheet in which a thin workpiece for the first punch work is mounted on a die.
Figure 5B:
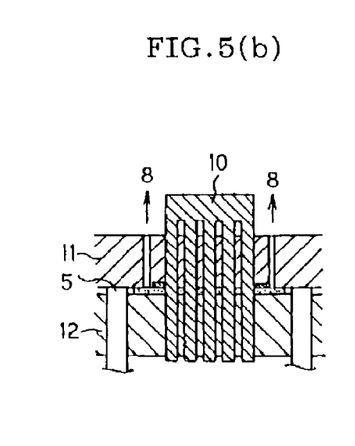
FIG. 5(b) illustrates the first punching step in which the first sheet of workpiece is perforated.
Figure 5C:
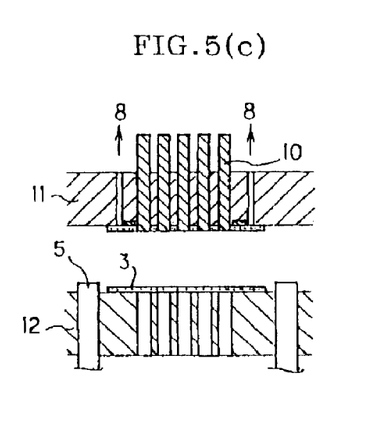
FIG. 5(c) illustrates a preparatory step for the second sheet.

FIG. 5(a) illustrates a state in which a thin workpiece 3 as the first sheet for punch work is mounted on a die 12 in preparation for the perforation. At this point, the jack-up shim 5 is shifted upward so that it protrudes from the workpiece 3 on the die 12 by approximately 5 to 15 μm above its height. Subsequently, the workpiece 3 as the first sheet for punch work is perforated by the punch 10 as illustrated in FIG. 5(b). The stripper 11 does not directly impinge on the workpiece 3 but collides with the jack-up shim 5 that protrudes slightly from the workpiece 3. Therefore, even if the workpiece 3 comprises an extremely soft material, it is not subjected to deformation at the time of the punch work, thus enabling perforations formed on the workpiece 3 to possess high precision. Next, a preparatory step for the second sheet begins as illustrated in FIG. 5(c), wherein the perforated workpiece 3 as the first sheet for punching is transferred upward while it is tightly attached to the stripper 11 and left pierced by the punch 10. Subsequently, the height of the jack-up shim 5 that protrudes from the upper surface of the die 12 is readjusted so that it is approximately 5 to 15 μm greater than the sum of the thickness of the workpiece 3 that has already been perforated and lifted while being pierced by the punch 10 and that of the workpiece 3 mounted on the die 12 for the next punching operation.

Figures 5D, 5E:
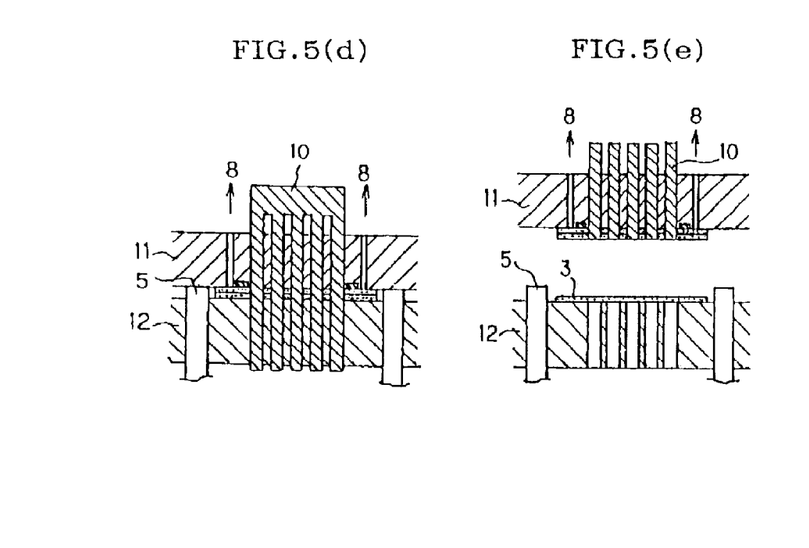
FIG. 5(d) illustrates the second punching step.
FIG. 5(e) illustrates a preparatory step for the third sheet.
Figure 5F:
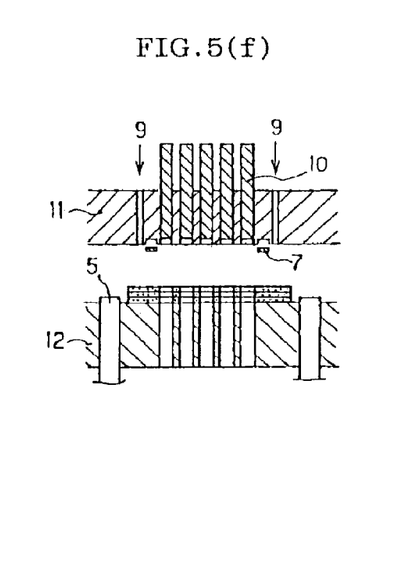
FIG. 5(f) illustrates a completing step for the sheet punching in which the stack of laminated workpieces for punching is removed from the stripper after completing the punch work and lamination for the entire stack of sheets.
Figure 6A:
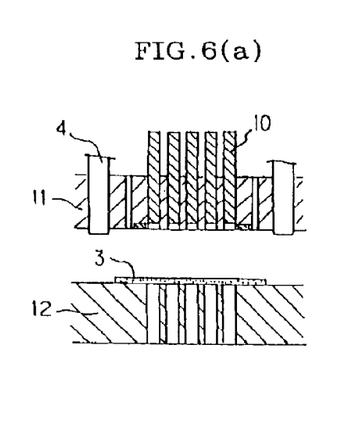
FIG. 6(a) illustrates a preparatory step for the first sheet in which a thin workpiece for the first punch work is mounted on a die.
Figure 6B:
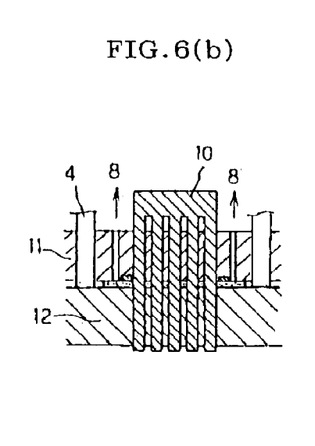
FIG. 6(b) illustrates the first punching step in which the first sheet of workpiece is perforated using a punch.
Figure 6C:
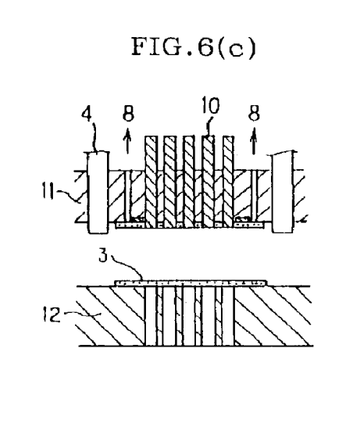
FIG. 6(c) illustrates a preparatory step for the second sheet.
Figure 6D:
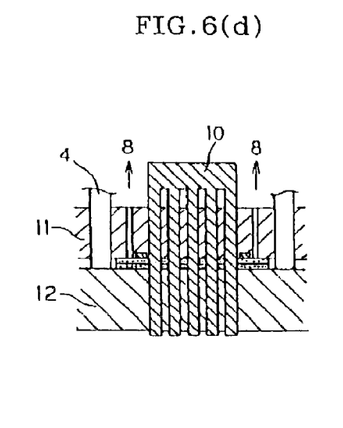
FIG. 6(d) illustrates the second punching step.
Figure 6E:
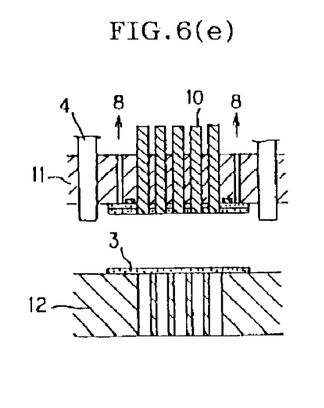
FIG. 6(e) illustrates a preparatory step for the third sheet.
Figure 6F:
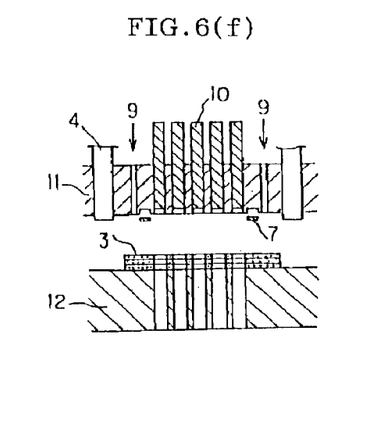
FIG. 6(f) illustrates a completing step for the sheet punching in which the stack of laminated workpieces for punching is removed from the stripper after completion of the punch work and lamination for the entire stack of sheets.

FIG. 5(d) illustrates the punching step for the workpiece 3 as the second sheet for punch work. As in the case of the first sheet illustrated in FIG. 5(b), the stripper 11 does not directly impinge on the workpiece 3 but collides with the jack-up shim 5, thereby protecting the workpiece 3 from deformation. For the same reasons as in the previous step, perforations formed on the workpiece 3 will possess high precision. Next, a preparatory step for the third sheet follows as illustrated in FIG. 5(e). As in the previous steps, the height of the jack-up shim 5 that protrudes from the upper surface of the die 12 is adjusted again so that it is approximately 5 to 15 μm greater than the sum of the thickness of the workpiece 3 that has already been perforated and lifted while being pierced by the punch 10 and the workpiece 3 mounted on the die 12 for the next punch work to prevent the stripper 11 from directly impinging on the workpiece 3. By repeating the above steps, a plurality of workpieces 3 is laminated one by one within the punching machine. After perforating and laminating all sheets of the workpieces 3 as illustrated in FIG. 5(f), the laminated workpieces 3 are removed from the stripper 11 to complete the entire punching step.

As already mentioned in the previous section, there are no specific limitations for the shape of the spacer. Accordingly, when using the jack-up shim 5 as the spacer, although it is not shown in the diagrams, the cross-sectional view in the horizontal direction of the jack-up shim 5 may for example be in the shape of a rectangle sandwiching the workpiece 3, or in a round or square shape to be placed at the four corners of the workpiece 3, or a framework shape surrounding the workpiece 3.

The type of jack-up shim to be used as the spacer is not limited to the jack-up shim 5 as illustrated in FIGS. 5(a) to 5(f) that moves up and down inside the die 12, but can also be a jack-up shim 4 as illustrated in FIGS. 6(a) to 6(f) that moves up and down inside the stripper 11. FIGS. 6(a) to 6(f) illustrate an example of a manufacturing process using a jack-up shim 4.

The jack-up shim 4 as illustrated in FIGS. 6(a) to 6(f) is configured to move up and down inside the stripper 11 adjusting its height of protrusion from the lower surface of the stripper 11 so as to form a space between the die 12 and the stripper 11 at the time the punch 10 performs, thereby preventing the stripper 11 from directly impinging on the workpiece 3 for punching and subjecting the workpiece 3 to a compression force.

The details of functions of the jack-up shim 4 as a spacer and the manufacturing process using it will be omitted as they are analogous to those described earlier for a manufacturing process using the jack-up shim 5 as illustrated in FIGS. 5(a) to 5(f).

Generally speaking, in a punching machine, since a lesser number of components exist in the lower die compared to the upper die, making it easier to secure a space to install a jack-up shim and a lifting mechanism for the shim, it is more advantageous to employ a jack-up shim 5 than a jack-up shim 4. Further, When the jack-up shims 4 and 5 are compared with the insertion shim 6 as illustrated in FIGS. 4(a) to 4(f), while the insertion shim 6 offers advantages in terms of initial cost as well as retooling cost required at the time of changes in the thickness of workpiece for punch work, the jack-up shims 4 and 5 which have a possibility of integrating into an automated process offer a higher processing speed which will contribute to an improvement in the throughput and eventually a reduction in cost of the punched product being manufactured.

Figure 7:
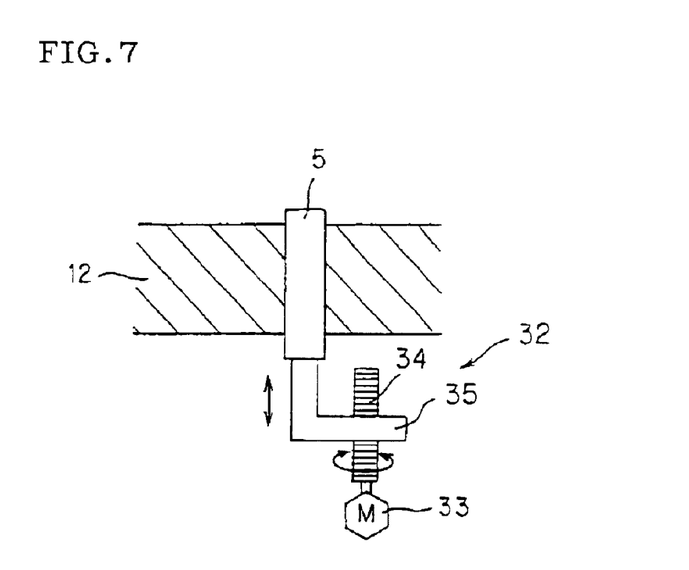
FIG. 7 is a cross-sectional view illustrating an example of a lifting mechanism for shims that are used as spacers according to the present invention.

An example of a lifting mechanism for moving a shim up and down is given in FIG. 7, which is a schematic diagram illustrating a jack-up shim 5 that moves up and down inside the die 12 and a lifting mechanism 32 attached to it. The lifting mechanism 32 comprises a servo-motor 33 and a linkage mechanism, whereby a rotating motion generated by the high-precision servo-motor 33 is converted to a linear motion, for example by the linkage mechanism comprising a male screw 34 driven by the servo-motor 33 and a female screw 35 that engages the former, which enables accurately moving the jack-up shim 5 up and down.

EXAMPLES

A punching operation was performed to form 100 perforations having an individual aperture width of 90 μm, a length of 3 μm, and with a punching pitch of 170 μm, i.e. with an interspace between two juxtaposing perforations being 80 μm. A ceramics green sheet having a thickness of 50 μm was used as a material for punching.

After the ceramics green sheet was processed with a die-punching unit comprising a punch and a die to form the desired perforations, the ceramics green sheet was secured to a stripper using a vacuum chuck to lift it from the die. The punch was not completely extracted from the perforation, allowing the tip of the punch to protrude from the bottommost surface of the perforation by 1 mm.

It was observed that, of the punched fragments generated during the process, while a portion was removed from the counterbore side of the die with a vacuum suction applied there, another portion came out adhering to the punch. However, the latter was easily removed with an adhesive roller.

After repeating the punching steps, as described above, eight times, perforations having an aperture width of 90 μm, a length of 3 μm, and a depth of 0.4 μm were formed on a lamination of ceramics green sheet, exhibiting high precision and a high aspect ratio.

As described previous sections, according to the present invention, punched fragments can be easily removed in a punching operation using a punch and a die, even under the condition where only a limited space is available at the counterbore part of the die. In particular, there remains practically no punched fragment inside the perforations after they are formed by the punch work. Consequently, when forming micro-sized perforations on a workpiece with high precision and in high density, even using a soft material that generates punched fragments prone to adhering to the punch, the present invention does not exhibit problems related to residual punched fragments or the like, to dramatically improve yield of products being fabricated with the punch work.

Moreover, by applying the present invention for example to provide products such as a circuit board having perforations of a size in the order of several tens of microns, this can contribute to improving the mounting technology for installing industrial components consisting mainly of electronic devices, which creates an excellent effect such as providing a product that can offer more compactness and convenience.

What is claimed is:

1. A method for removing punched fragments using a punch and a die, characterized by:
   forming a perforation in a workpiece by punching the workpiece using the punch;
   lifting the workpiece, tightly attached to a stripper, from the die without extracting the punch from the perforation; and
   removing punched fragments in a condition where the punch is pulled up so that a tip portion of the punch protrudes slightly from the bottommost end of the perforation.

2. The method according to claim 1, wherein the punched fragments are removed from the die either with an air-blow technique which removes the punched fragments using a flow of compressed air, or with an adhesion technique which removes the punched fragments by having the punched fragments adhere to an adhesive medium.

3. The method according to claim 1, wherein the aperture diameter of the perforation or the shortest distance from one edge to an opposing edge of the perforation is 100 μm or less.

4. The method according to claim 1, wherein the space between the juxtaposing perforations is 100 μm or less.

5. The method according to claim 2, wherein the space between the juxtaposing perforations is 100 μm or less.

6. The method according to claim 3, wherein the space between the juxtaposing perforations is 100 μm or less.

7. A method of manufacturing punched products using a punch and a die, characterized by comprising:
   a step A of piercing a first workpiece punching to form a first perforation in the first workpiece;
   a step B of lifting the first workpiece, tightly attached to a stripper, from the die without extracting the punch from the first perforation;
   a step C of pulling up the punch so that a tip portion of the punch protrudes slightly from the bottommost end of the first perforation;
   a step D of removing punched fragments;
   a step E of piercing a second workpiece punching to form a second perforation in the second workpiece;
   a step F of lifting the second workpiece together with the first workpiece without extracting the punch from the second perforation;
   a step G of pulling up the punch so that the tip portion of the punch protrudes slightly from the bottommost end of the second perforation; and
   a step H of removing punched fragments, and thereafter laminating a plurality of workpieces to be punched with repetition of the steps E to H.

8. The method according to claim 7, wherein the punch is pulled up after removing the punched fragments in the step D so that the tip portion of the punch is recessed slightly from the bottommost end of the first perforation, and the punch is pulled up after removing the punched fragments in the step H so that the tip portion of the punch is recessed slightly from the bottommost end of the second perforation.

9. The method according to claim 7, wherein the punched fragments are removed from the die by applying either an air-blow technique which removes the punched fragments using a flow of compressed air, or an adhesion technique which removes the punched fragments by having the punched fragments adhere to an adhesive medium.

10. The method according to claim 8, wherein the punched fragments are removed from the die by applying either an air-blow technique which removes the punched fragments using a flow of compressed air, or an adhesion technique which removes the punched fragments by having the punched fragments adhere to an adhesive medium.

11. The method according to claim 7, wherein a spacer is inserted between the die and the stripper when forming the perforation in the workpiece using the punch in the step A and the step E.

12. The method according to claim 11, wherein the thickness of the spacer is approximately 5 to 15 μm greater than the sum of the thickness of the workpieces present between the die and the stripper.

13. The method according to claim 7, wherein the aperture diameter of the perforation or the shortest distance from one edge to an opposing edge of the perforation is 100 μm or less.

14. The method according to claim 8, wherein the aperture diameter of the perforation or the shortest distance from one edge to an opposing edge of the perforation is 100 μm or less.

15. The method according to claim 9, wherein the aperture diameter of the perforation or the shortest distance from one edge to an opposing edge of the perforation is 100 μm or less.

16. The method according to claim 7, wherein the space between the juxtaposing perforations is 100 μm or less.

17. The method according to claim 8, wherein the space between the juxtaposing perforations is 100 μm or less.

18. The method according to claim 9, wherein the space between the juxtaposing perforations is 100 μm or less.

* * * * *